United States Patent [19]

Bartholomew et al.

[11] Patent Number: 6,143,080
[45] Date of Patent: Nov. 7, 2000

[54] WAFER PROCESSING REACTOR HAVING A GAS FLOW CONTROL SYSTEM AND METHOD

[75] Inventors: Lawrence D. Bartholomew, Felton; Robert J. Bailey, Santa Cruz; Robert A. Ewald, Aptos; John T. Boland, Scotts Valley, all of Calif.

[73] Assignee: Silicon Valley Group Thermal Systems LLC, Scotts Valley, Calif.

[21] Appl. No.: 09/493,492

[22] Filed: Jan. 28, 2000

Related U.S. Application Data

[60] Provisional application No. 60/118,286, Feb. 2, 1999.

[51] Int. Cl.[7] .................................................. C23C 16/00
[52] U.S. Cl. ........................................ 118/718; 118/715
[58] Field of Search ..................................... 118/715, 718

[56] References Cited

U.S. PATENT DOCUMENTS

| | | | |
|---|---|---|---|
| 4,834,020 | 5/1989 | Bartholomew et al. | 118/719 |
| 5,136,975 | 8/1992 | Bartholomew et al. | 118/715 |
| 5,413,671 | 5/1995 | Ketchum | 216/37 |
| 5,683,516 | 11/1997 | DeDontney et al. | 118/718 |
| 5,776,254 | 7/1998 | Yuuki et al. | 118/725 |
| 5,849,088 | 12/1998 | DeDontney et al. | 118/719 |
| 5,863,337 | 1/1999 | Neuman et al. | 118/718 |
| 5,888,579 | 3/1999 | Lun | 427/8 |
| 5,976,258 | 11/1999 | Kleiner | 118/718 |
| 6,022,414 | 2/2000 | Miller et al. | 118/718 |

*Primary Examiner*—Jeffrie R Lund
*Attorney, Agent, or Firm*—Flehr Hohbach Test Albritton & Herbert LLP

[57] ABSTRACT

A wafer processing system for delivering a processing gas and an inert gas to a chamber which includes a CVD processing region having a plurality of gas flow paths for conveying the gases to the chamber and exhausting them from the chamber. A flow control system is coupled to each of the exhaust gas flow paths and each of the process gas exhaust flow paths are separately controlled to maintain a constant rate of flow within each of the gas flow paths, independent of the accumulation of deposition byproducts. Utilization of a self-cleaning orifice allows a pressure differential measurement in a process exhaust line to measure flow. The wafer processing system is provided with load and unload regions surrounding the chamber(s), each having additional inert gas exhaust flow paths. A flow characteristic, preferably pressure differential across an orifice, of the gases in each of the regions is measured and a flow control unit is selectively adjusted to maintain a substantially constant exhaust flow rate from each of the regions, in order to compensate for any pressure imbalance across the chamber due to internal (thermal load) or external (environmental) asymmetry that would degrade the performance of an APCVD system.

21 Claims, 9 Drawing Sheets

WAFER PROCESSING REACTOR HAVING A GAS FLOW CONTROL SYSTEM AND METHOD

PRIOR APPLICATIONS

The application claims priority to Provisional Application No. 60/118,286 filed Feb. 2, 1999.

FIELD OF THE INVENTION

This invention relates generally to the field of wafer processing reactors or systems and methods used in the manufacture of semiconductors and integrated circuits. More specifically, the invention relates to a reactor and gas flow control system and method for controlling the flow of gases within chemical vapor deposition (CVD) systems.

BACKGROUND OF THE INVENTION

Wafer processing reactor systems and methods are widely used in the manufacture of semiconductors and integrated circuits. One particular type of wafer processing system utilizes chemical vapor deposition (CVD) to deposit films or layers on the surface of a substrate as a step in the manufacture of semiconductors and integrated circuits. A variety of different CVD systems are used in the art. For example, films may be deposited using low pressure CVD (LPCVD) systems, atmospheric pressure CVD (APCVD) systems or different types of plasma enhanced CVD (PECVD) systems. In general principle, all such systems employ a deposition chamber where certain injected gaseous chemicals react and deposit a layer of material on the surface of the substrate. Many types of materials may be deposited, with dielectrics such as oxides and doped oxides being a typical example.

For proper operation of the system, and in particular to deposit a film of desired quality and repeatability, the flow of the gases within the reactor is important. Specifically, it is desirable to achieve a substantially uniform flow of gases in the area proximate the surface of the substrate so that certain concentrations of the gaseous chemicals or reactants are available at the surface of the substrate so that a proper film is deposited. Moreover, control of the flow of such gases will promote more efficient utilization of the gases for reaction.

Another important criterion when depositing films is the thickness uniformity of the film. It is desirable to achieve a film of substantially uniform thickness over the entire surface of the substrate. This endeavor becomes even more important as the diameter of substrates continues to increase. The flow of the reactive gases within the chamber plays an important role in the resulting film thickness. Thus, it is desirable to control the flow rate of the gases and to promote substantially uniform flow of the reactive gases over the entire surface of the substrate.

A further consideration which warrants considerable attention in wafer processing systems is the minimizing of particles and contaminants that form in the reactor. Particulates and contaminants are caused mainly by the accumulation of unreacted and by-product gaseous chemicals and the formation of deposits (often called powder build-up) on the surfaces of the reactor. Such deposits are a large source of particles which can contaminate the films being deposited on the substrate. To remove the deposits the system must be taken offline and serviced. Contaminates and gaseous chemicals that accumulate in stagnant flow regions promote corrosion of the reactor and can severely reduce the longevity of the system, as well as contribute to the contamination problem. The flow of inert and reactive gases plays an important role in either promoting, or minimizing, the accumulation of unreacted and by-product gaseous chemicals, which determine, in part, the extent of the powder build-up. Thus, it is desirable to provide a system that promotes control of the inert and reactive gas flows to minimize accumulation and powder build-up.

It has been found that the control of the exhaust flow rate of the varies gases may be used to address the aforementioned concerns. Problems occur when the exhaust system of a reactor does not function properly. For example, if the exhaust flow rate is too high, the gases do not completely react and deposition on the surface of the substrate is hampered. Conversely, if the exhaust flow rate is too slow, the gas flows are undefined and accumulate in the chamber causing deposits to form on the chamber walls. Accordingly, it is desirable to provide a system and method that controls, or "meters," the exhaust flow of gases; that is, a system and method that achieves and maintains certain selected gas flow rate values within the system. Additionally, since powder build up does occur, it is desirable to provide a system and method which employs control means which accurately control the gas flows and do not deteriorate over time.

One prior art method described in U.S. Pat. No. 5,851,293 employs a system that controls flow fluctuations in an effluent downstream of a reactor to dampen fluctuations upstream in the reactor. This system also employs an abatement system which treats the effluent from the reactor. This system appears to only operate to dampen pressure fluctuations, and does not provide meaningful process feedback control of the gas flows in the upstream system because the downstream sensor does not maintain a constant relationship between pressure and flow due to clogging from powder accumulation. Moreover, this system does not provide a method of metering the flow rates of the various exhaust gases to achieve and maintain desired values of the inert and reactive gas flows within the chamber.

In another aspect, it has been found that loading and unloading of a reactor can cause transient disturbances, such as pressure disturbances, within the reactor. Thus, it is desirable to provide a system and method that controls and minimizes such disturbances.

SUMMARY AND OBJECTS OF THE INVENTION

Accordingly, it is an object of the present invention to provide an improved wafer processing system, and more particularly an improved chemical vapor deposition (CVD) system.

It is an object of the present invention to provide a system and method that provides flow control of the gases within the wafer processing system.

More specifically, it is an object of the present invention is to provide a system and method that provides repeatable control and metering of the gas flow rates within the system.

Another object of the present invention is to provide a system and method that minimizes accumulation of gases and the formation of unwanted deposits within the system.

A further object of the present invention is to provide a system and method that promotes the deposition of substantially uniform films on the surface of substrates.

Yet another object of the present invention is to provide a system and method that minimizes transient disturbances within the system.

A related object of the present invention is to provide a system where maintenance downtime is reduced and the longevity of the system is increased.

These and other objects of the invention are achieved by a wafer processing system for delivering at least one gas, comprising: a chamber including a processing region formed therein and having a plurality of gas flow paths for conveying inert and reactive gases. Exhaust flow paths are provided for the exhaust of inert gases and effluent gases from the reaction of the reactive gases. A flow control system is coupled to each of the exhaust gas flow paths and each of the gas flow paths are separately controlled to maintain a selected, substantially constant flow rate of the gases within each of the gas flow paths.

In another embodiment of the present invention, a method of delivering and exhausting a gas in a reactor is provided. The method comprises the steps of establishing at least one gas flow path within the reactor. The gas is conveyed through the gas flow path and a flow characteristic of the gas is measured. A flow control unit, responsive to the measured flow characteristic, is selectively adjusted to maintain a flow rate of the gas at a selected, substantially constant value. Additionally, the gas may travel through a plurality of gas flow paths, and the flow rates of the gases are separately adjusted to maintain selected gas flow rates within each of the gas flow paths. Further, the gas flow rates may be maintained at a substantially constant value within each of the gas flow paths to promote uniform delivery and exhaust of the gases, even if the gas temperature or geometry of the path changes over time.

In yet another embodiment of the invention two gas flow paths are defined by load and unload regions of the reactor for atmospheric pressure CVD in an open system subject to the ambient environment. The reactor is provided with load and unload regions at opposites ends of the reactor surrounding the open deposition chamber. A flow characteristic, preferably pressure, of the gases in each of these regions is measured and a flow control unit is selectively adjusted to maintain a substantially constant differential pressure across the open chamber. In this manner the flow of the gases in the deposition chamber stays balanced and is not substantially disturbed by transients, such as pressure transients, in the system, due to the exposure to the environment. This system may be referred to as the muffle balance system, or transient pressure response. The exhaust flows from the deposition chamber are also maintained at a selected, substantially constant, value by protecting the flows and pressure within the chamber from external perturbation.

BRIEF DESCRIPTION IF THE DRAWINGS

These and other objects and advantages of the present invention are made apparent in the following detailed description and the appended claims, and upon reference to the drawings in which:

FIG. 3b is a top plan view illustrating the path of various gases and effluents as they are exhausted through the CVD system of FIG. 3a.

DETAILED DESCRIPTION OF THE INVENTION

Figure 1:
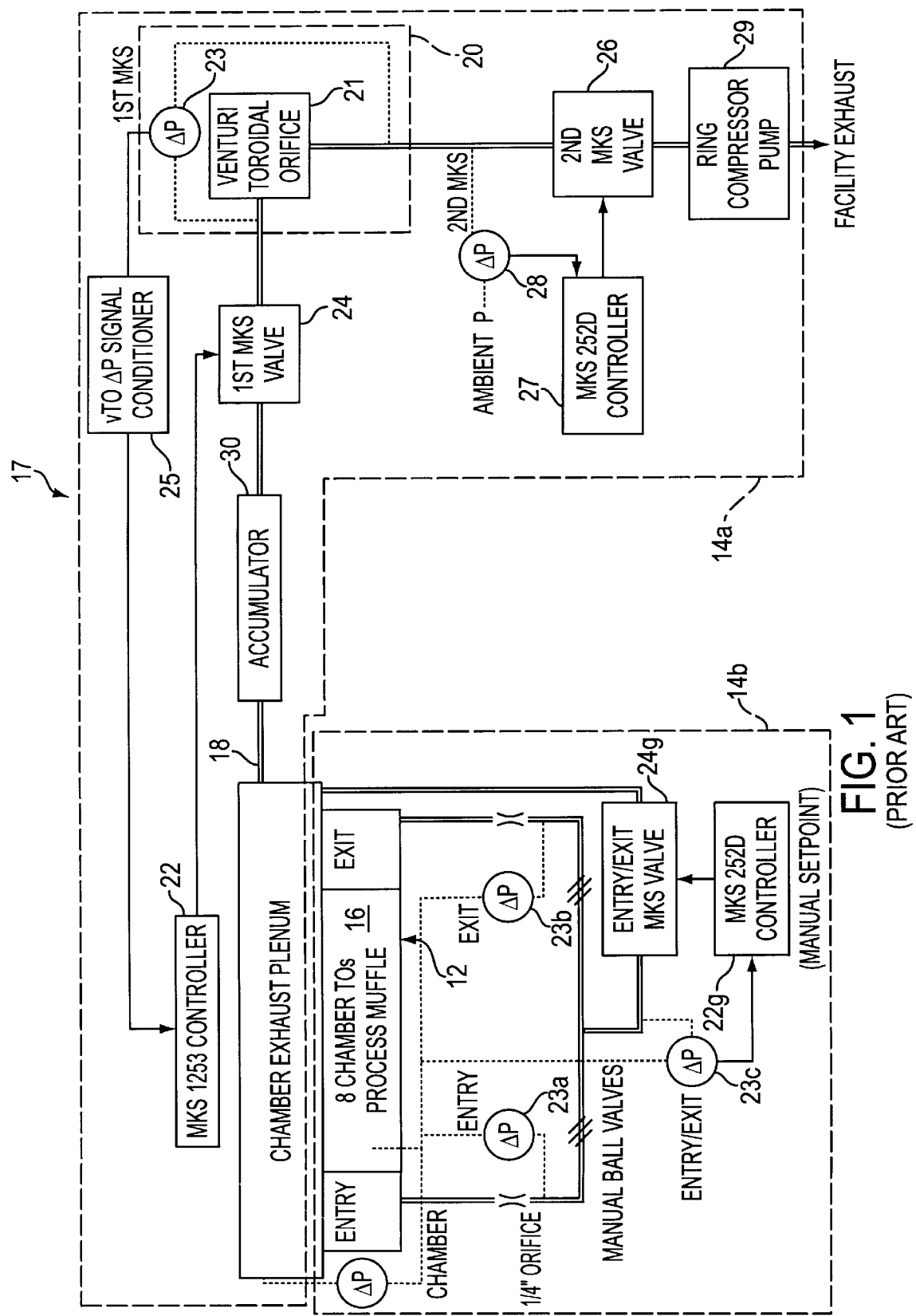
FIG. 1 is a schematic diagram of a prior art wafer processing system and exhaust flow control system.

Turning to the drawings, where like components are designated by like reference numerals, a prior art wafer processing system with an exhaust flow control system is shown with reference to FIG. 1. The wafer processing system 10 includes a reactor 12 and exhaust flow control system 14. The reactor includes a chamber 16 and a gas flow path 18 which conveys effluents from the reactor 12. Many types of reactors can be employed, such as various CVD reactors and etching reactors.

Referring to FIG. 1, the flow control of two gas paths is shown. Specifically, the control system 14 is comprised of two sub-systems, 14a and 14b. There is one for each gas flow path. The first flow control system 14a operates as the flow control for one gas flow path, in this case the chamber exhaust gas flow path. The second control system 14b operates as the flow control for the second flow path, in this case the entry/exit (load/unload) exhaust gas flow path. In its simplest form, the flow control system includes a sensor for detecting a flow characteristic of the gas(es) within the gas flow path of interest. A controller is coupled to the sensor and receives the flow characteristic measurement, such as differential pressure across an orifice, from the sensor. The controller is coupled to a flow control device, and based on the measurements received from the sensor, the controller adjusts the flow control device to achieve a certain flow characteristic. The system operates as a feedback control system with the controller continuing to receive signals form the sensor and making adjustments via the flow control unit as necessary.

More specifically, the flow control system 14a includes a sensor 20 for measuring a flow characteristic of the at least one gas in the gas flow path 18, and a controller 22 which receives an output from the sensor 20. The controller 22 selectively adjusts a flow control device 24 responsive to the controller signal. The flow device 24 adjusts such that a selected flow rate is achieved and/or maintained within the gas flow path. Preferably, the controller 22 is a computer as known in the art. Any suitable sensor may be used, however, in the preferred embodiment, the sensor 20 is comprised of a toroidal orifice 21 and a pressure transducer 23. The pressure transducer 23 senses the pressure drop ($\Delta P$) across the orifice and sends a corresponding output signal to the controller 22. Preferably a signal conditioner 25 may be used, such as a vTO $\Delta P$ signal conditioner as known in the art which provides a time averaged $\Delta P$ value for reducing noise. Similarly, any suitable flow control device 24 may be used, with a MKS flow control valve being preferred.

Of particular advantage, the flow control system employs a toroidal orifice as part of the sensor 20. A suitable toroidal orifice is fully described in U.S. Pat. No. 5,113,789, which is incorporated by reference herein. The toroidal orifice is self cleaning; that is, powder buildup that accumulates in the throat of the orifice is removed so the orifice remains clear and does not narrow with debris. Such a design minimizes faulty pressure drop readings that would occur if the orifice were clogged. This self cleaning toroidal orifice provides more accurate pressure drop readings which correlate better to mass flow and result in more accurate and repeatable flow control. The design of a sensor that can correctly measure the pressure, flow or other characteristic of a dirty effluent gas stream, independent of the powder accumulation and changing geometry of the exhaust line, is the crucial element necessary for improved process gas flow control.

In the exemplary embodiment of prior art, a second MKS valve 26 is used downstream of the flow control sensor 20. The second MKS valve 26 is separately controlled by a second controller 27. A second pressure transducer 28 is placed in the line for measuring the pressure in the gas flow path downstream of the sensor 20. Based on the pressure readings provided by the pressure transducer, the second controller 27 commands the MKS valve 26 to open or close as necessary to maintain a selected line pressure in the path such that the sensor 20 is always operating at a constant pressure. Finally, a pump 29 such as a ring compressor pump may be installed in the gas flow path to convey the gases though to a facility exhaust.

As shown further in FIG. 1 any number of units may be placed within the gas flow path without disrupting the flow control system. For example, an accumulator 30 is placed in the chamber exhaust gas flow paths 18. In this particular application, the accumulator 30 acts as a low frequency attenuator and a trap for collecting powder (i.e. reaction deposits) present in the exhaust gas stream. The flow control sensor and flow control unit can be located at any suitable position within the effluent gas flow path.

FIG. 1 shows a second flow control system 14b for controlling the flow of gases in another gas flow path, in this instance the entry/exit exhaust gas flow path. Differential pressure transducers 23a and 23b provide signals representing the flow from the entry and exit regions at the external ends of the deposition system 12. Transducer 23c provides a signal representing the combined flow as a control signal to the controller 22g which operates the valve 24g to control the flow of inert gas to the exhaust 18. The exhaust valve operates to maintain a preset flow of inert gases from the entry and exit ends of the system.

As the gases react and form a layer or film of the surface of the wafer, it is important to achieve and maintain a selected flow rate of the gases. As described above the flow rate of the gases affect the extent and uniformity of the deposition reaction. Of particular advantage, the present invention provides for controlling the flow rate of the various gases within an associated gas flow path. The gas flow path may be any defined path of the gases and will vary depending on the type of application and the mechanical design of the system. For the wafer processing system of the type shown herein, the inventors have found that it is generally preferred to select the exhaust path of the gases as the gas flow path for controlling certain flow rates. However, in certain circumstances it is also preferred to select an inlet gas flow path as well. As described herein the present invention teaches the selective control of the flow rate of a plurality of gases in a plurality of gas flow paths such that their flow rate is obtained and/or maintained at a selected value. The selected value will depend on a variety of factors but is primarily selected such that the surface of the substrate is uniformly processed. This allows for the "metering" of the gas. The present invention provides for separately metering each gas flow path; that is, providing compensated feedback control of the gases within each of the gas flow paths.

Figure 2:
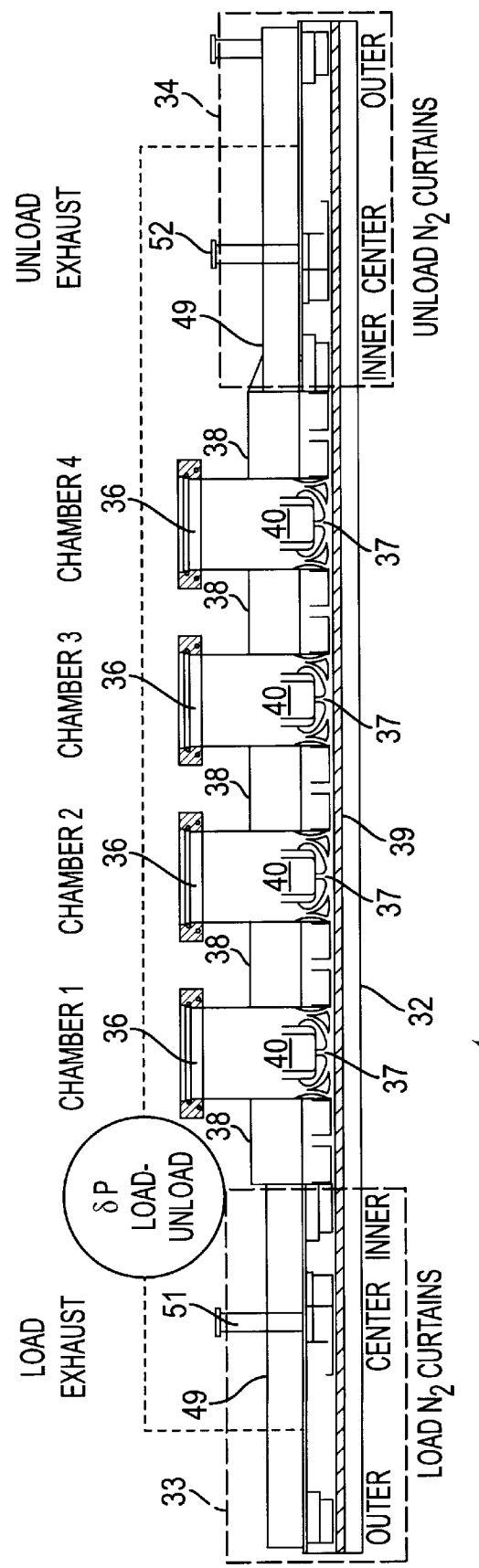
FIG. 2 is a schematic cross-sectional view of an exemplary chemical vapor deposition system having an improved gas flow path design which may be used in the present invention.

FIGS. 2 and 3 illustrate a wafer processing reactor where the system and method of the present invention may be employed. FIG. 2 is a cross-sectional schematic view of a CVD reactor 30. Specifically, the CVD reactor 30 is a conveyorized atmospheric pressure CVD reactor of the type described in U.S. Pat. Nos. 4,834,020 and 5,136,975, incorporated herein by reference. While, a specific type of CVD reactor with its specific gas flow paths is shown, it will be understood to those of ordinary skill in the art that the present invention may be employed with different types of reactors each having different defined gas flow paths.

Figure 3A:
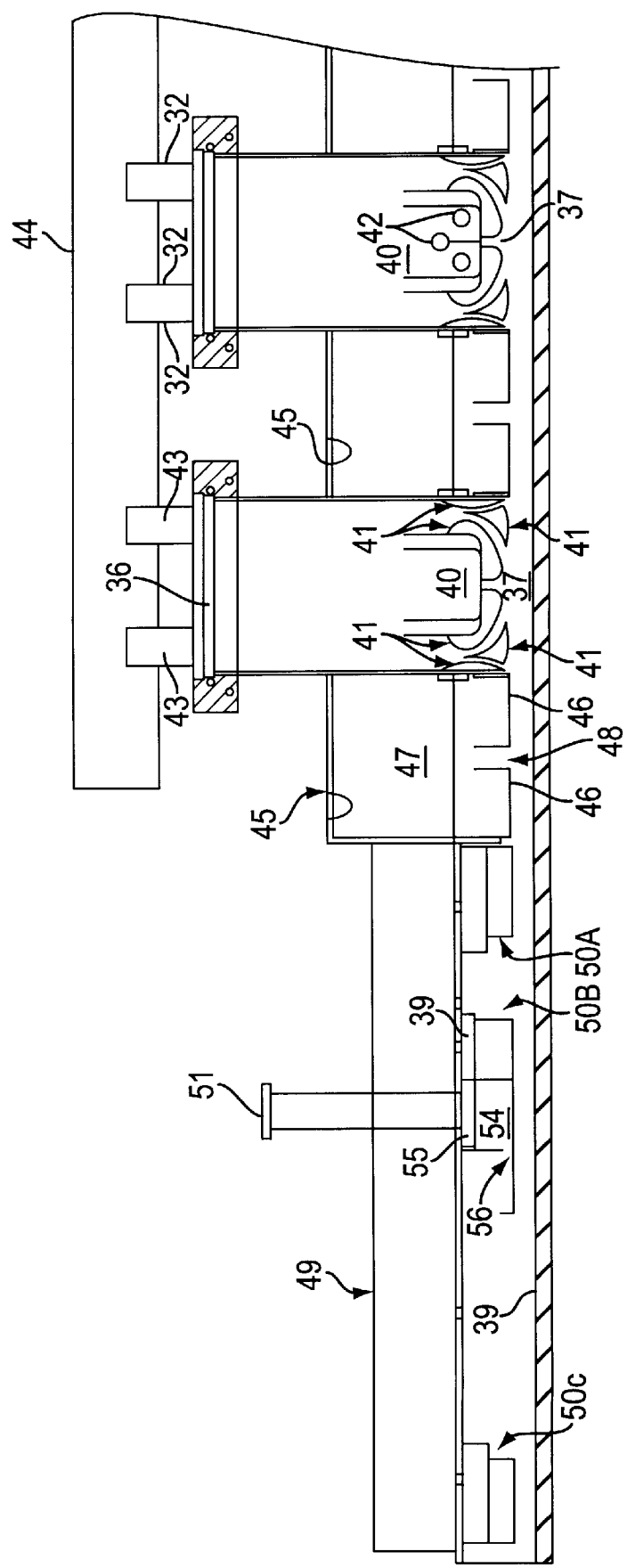
FIG. 3a is an enlarged cross-sectional view showing a portion of the system of FIG. 2.

In general, the CVD reactor 30 includes a muffle 32, having load 33 and unload 34 regions positioned at opposite ends of the muffle 32. The muffle 32 includes at least one chamber 36 having an injector 40 and protective shield assembly 41 positioned therein. A deposition region 37 is formed in the area underneath the injector 40 and shield assembly 41. The process module 36 is surrounded by adjacent buffer modules 38. The buffer modules 38 act to isolate the processing module 36 and deposition region 37 from the rest of the processing path and muffle. A conveyorized transport means 39 extends through the muffle 32 for conveying substrates through the chambers 36. The reactor chamber, including the muffle 32, injector 40 and protective shield assembly 41 are described in greater detail in U.S. Pat. Nos. 5,683,516 and 5,849,088, the entire descriptions of which are expressly incorporated herein by reference. The exemplary embodiment of FIG. 2 shows four chambers 36 and five buffer modules 38, however it should be understood that any number of chambers and buffer modules may be used, and the number will vary depending on the design of the muffle and reactor. In an exemplary embodiment, the chamber includes an injector 40 which has ports for delivering gases to the deposition region 37. As shown in FIG. 3a, the protective shield assembly is positioned adjacent and around the injector. The protective shield 41 conveys inert gases, preferably nitrogen, to the deposition region 37. This inlet gas flow helps to isolate the deposition region 37, and also increases the longevity of the system by minimizing powder build-up on the injector and chamber surfaces.

The load region 33 is placed at one end of the muffle 32, and at the opposite end of the muffle is the unload region 34. To deposit films on the surface of a wafer, the load region 33 is configured to receive wafers or semiconductor circuits for processing. Typically, an automatic load mechanism (not shown) is employed to place the wafers into the load region 33 of the muffle 32. Wafers are conveyed through the muffle by the transport means 39. Preferably, the transport means 39 is a motorized belt, however any suitable conveying means may be used. The wafers pass through the muffle 32 and deposition regions 37 where the wafers are processed. The wafers then exit the muffle 32 through the unload region 34.

As shown in more detail with reference to FIG. 3a, each processing module 36 includes an injector 40 for injecting chemical gases or reagents into the deposition region 37 positioned directed below the injector 40. Conduits (not shown) convey the gases to the injectors 40, which preferably convey the gases through separate conduits to injector passages 42. Although not shown, each injector passage 42 extends lengthwise along the longitudinal axis of the injector 40 to deliver the gases in a sheet-like flow across the deposition region 37. An injector is described in U.S. Pat.

No. 5,683,516, which is incorporated herein by reference. The gases interact within the deposition region 37 and deposit a layer of material on the surface of the substrate as the substrate is transported through the deposition region 37. The unreacted and deposition waste products are removed from the deposition region 37 through chamber exhaust vents 43. The chamber exhaust vents are coupled to a suitable exhaust system, such as a chamber exhaust plenum 44 as shown in the exemplary embodiment. This exhaust of the chamber process gases forms a gas flow path, referred to as the chamber exhaust gas path in this exemplary embodiment.

As the gases react and form a layer or film of the surface of the wafer, it is important to achieve and maintain a desired flow rate of the gases. As described above the flow rate of the gases effect the extent and uniformity of the deposition reaction. Of particular advantage, the present invention provides for controlling the flow rate of the gases within an associated gas flow path. The inventors have found that in this instance, it is preferred to select the exhaust gas flow path for controlling the flow rates. According to the present invention, one exhaust gas flow path is defined as the chamber exhaust gas flow path. The chamber exhaust gas flow path operates to expel the by-product and unused reactant gases from the deposition region 37. According to the system and method of the present invention, these gases are exhausted from the plenum 44 at a selected flow rate. Further, the invention provides for controlling the flow rate of these gases within the chamber exhaust gas flow path by maintaining the selected flow rate at a substantially constant value. This provides more complete reaction of the reactant gases and more uniform deposition of the film on the wafer surface. Further, this control or "metering" of the reactant gases promotes the deposition of films having a more uniform thickness over the entire surface of the wafer.

To deposit high quality films, it is desirable to include inert gas flows within the reactor in addition to the reactant gases. Inert gases may be used to help confine the reactant gases to the deposition region. Further, inert gases may be used to isolate the deposition region from the rest of the system. Typically, inert gases are injected into the chamber through the side and/or bottom regions of the chamber. As represented in FIG. 3a, inert gas is injected into the deposition region 37 via shield components 41. To remove the inert gas in such a manner as to isolate the deposition region 37, buffer modules 38 are provided in the exemplary embodiment. The buffer modules 38 are positioned adjacent the chambers 36, with one buffer module 38 on each side of each chamber 36. The buffer modules 38 are elongated and extend across the reactor along the length of the chambers 36. The buffer modules 38 act to receive the excess inert gases from the chamber 36 as shown by arrows 70, FIG. 3b, and exhaust the gases through a separate gas flow path defined by bypass vents 49 as shown by arrows 72. As described above, the reactant gases are exhausted through the chamber exhaust gas flow path. The separation of gas flow paths in this manner allows for the tailoring of the flow rates of the gases to create a desired gas flow environment at the surface of the wafer and within the deposition region.

FIG. 3a shows the buffer modules 38 in greater detail. In this embodiment, the buffer modules are comprised of an elongated bypass duct 45 which extends across the muffle 32. The bypass duct module includes two elongated baffles 46 placed in the lower portion of the duct and a large cavity 47 above the baffles 46. The two baffles 46 are positioned adjacent one another and spaced apart to form a channel 48 therebetween. The channel 48 is elongated and extends the length of the bypass duct 45. Inert gases from the chamber 36 and elsewhere in the muffle 32 flow into the buffer modules and are removed via the bypass ducts 45. To exhaust the buffer modules 38, the bypass ducts 45 are connected to two bypass vents 49 along the sides of the muffle 32. One bypass vent 49 is positioned at each end of the bypass duct 45. The cavity portion 47 of the bypass duct 45 is open at each end of the duct 45 and thus forms a passageway into the bypass vent 49. Gases flow from the cavity into the bypass vents 49 positioned at each end of the by pass duct 45. Thus, another gas flow path is defined, termed the bypass exhaust gas flow path. The bypass exhaust gas flow path is formed by the buffer modules 38 and the bypass vents 49. Defining a bypass exhaust gas flow path allows the for the separation of gas flow paths within the chamber and for the separate control of the gases within the bypass exhaust and chamber exhaust paths. The flow rates within the chamber exhaust gas flow path and the bypass exhaust gas flow path can be selected such that the reactant gases are substantially exhausted through the chamber exhaust gas flow path, and the inert gases are substantially exhausted through the bypass exhaust flow path. This purposeful control of the gas flows within the chamber 36 promotes containment of the reactant gases in the deposition region 37. Such containment enhances the uniformity of the film deposited on the wafer and reduces powder buildup on the surrounding injector and chamber surfaces.

Wafer processing systems typically include a load and unload port for receiving and unloading the wafers. When the wafers are loaded into and removed from the system, the system is exposed to the exterior environment. Exposure to the exterior environment often introduces contaminates into the system. Accordingly, wafer processing systems may employ inert gas flow inlets in the load and unload regions to purge the regions of contaminants that enter the system through the load and unload ports. One example of such a system is shown in FIGS. 2 and 3. The reactor 30 includes a load region 33 and an unload region 34 positioned at opposite ends of the muffle 32. The load 33 and unload 34 regions each employ a plurality of gas inlets, or curtains 50, for injecting inert gas into the regions. Preferably, the curtains 50 inject a thin, elongated curtain like flow of inert gas. These curtains are shown as an inner 50A, center 50B and outer 50C curtain, however any suitable number of curtains may be used. This curtain of inert gas sweeps over the surface of the wafer passing beneath it, and "purges" the wafer surface. The curtain of inert gas also acts to isolate the chambers 36 and bypass duct 45 from the exterior environment.

In the exemplary embodiment, the load 33 and unload 34 regions are separately exhausted via exhaust ports 51 and 52, respectively. The load and unload exhaust ports 51 and 52 act to exhaust a substantial portion of the inert gas from each region. Preferably, the load 51 and unload 52 exhaust ports are positioned at approximately the middle of the load and unload regions, respectively. The exhaust ports may be comprised of any suitable gas outlet, and in the preferred embodiment, they each include a two stage plenum body 53 (only the load region is shown, the unload region is the same). Specifically, the plenum body 53 includes two elongated plenum stages, a lower plenum 54 and an upper plenum 55. The lower plenum 54 includes a slot 56 formed in the side of the lower plenum 54. The upper plenum 55 includes an array of holes (not shown) formed in the bottom surface of the upper plenum 55. Inert gases from each region are directed though the slot 56 in the lower plenum 54 and then conveyed through the holes into the upper plenum 55.

The gases are then conveyed out of the upper plenum 55 through the exhaust port 51. Thus, two additional gas paths are defined, termed the load and unload exhaust gas paths. The load and unload exhaust gas paths are formed by the plenum body 50 and the load and unload exhaust ports 51 and 52, respectively.

Figure 3B:
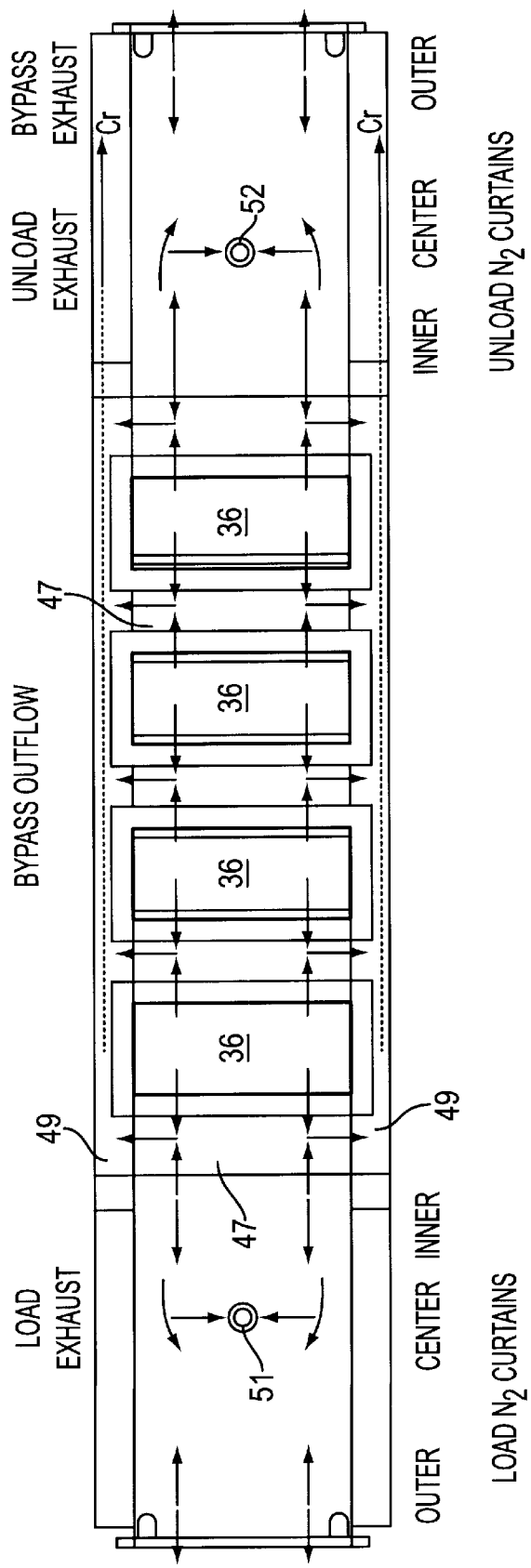

Defining a separate load and unload exhaust gas flow path allows the for the separation of gas flow paths within the muffle and for the separate control of the gases within the load and unload regions. The flow rates of the gases within the load and unload exhaust gas flow paths can each be selected and selectively controlled. This purposeful control of the gas flows within the load and unload regions promotes purging of the wafer surface as wafers are loaded and unloaded from the system. Further, control of the gas flows aids to isolate the chamber 36 from the rest of the muffle and external environment, and promotes containment of the reactant gases in the deposition region 37. For example, the flow rates of the gases in the load and/or unload regions can be selected such that the inert gases in these regions are substantially exhausted through the load and/or unload ports, respectively, but the flow rates are not so great as to draw reactant gases out of the deposition region 37 and into the exhaust ports 51 and/or 52. Alternatively, the flow rates of the gases in the load and/or unload exhaust gas flow paths can be selected such that a portion of the inert gas in the outermost buffer modules 38 are drawn into the load and/or unload exhaust gas flow paths. The flow rates of the gases in the load and/or unload exhaust gas flow paths can also be selected to compensate for an external pressure or flow imbalance, as can typically occur with the installation of an open APCVD System into a clean room pressurized environment. In other words, according to the present invention the gas flow paths can be selected to direct the flow of gases within the system in a variety of ways. Referring to FIG. 3b, the arrows schematically illustrate gas flow paths for the primarily inert gases.

As described above, the present invention provides great flexibility by allowing the definition of various gas flow paths. Thus, any number of gas flow paths can be defined and tailored to a specific application and system. Of course, many different gas flow paths can be defined and employed in the present invention, and the particular examples are provided for illustration purposes only and are not intended to limit the present teaching in any way.

Figure 4:
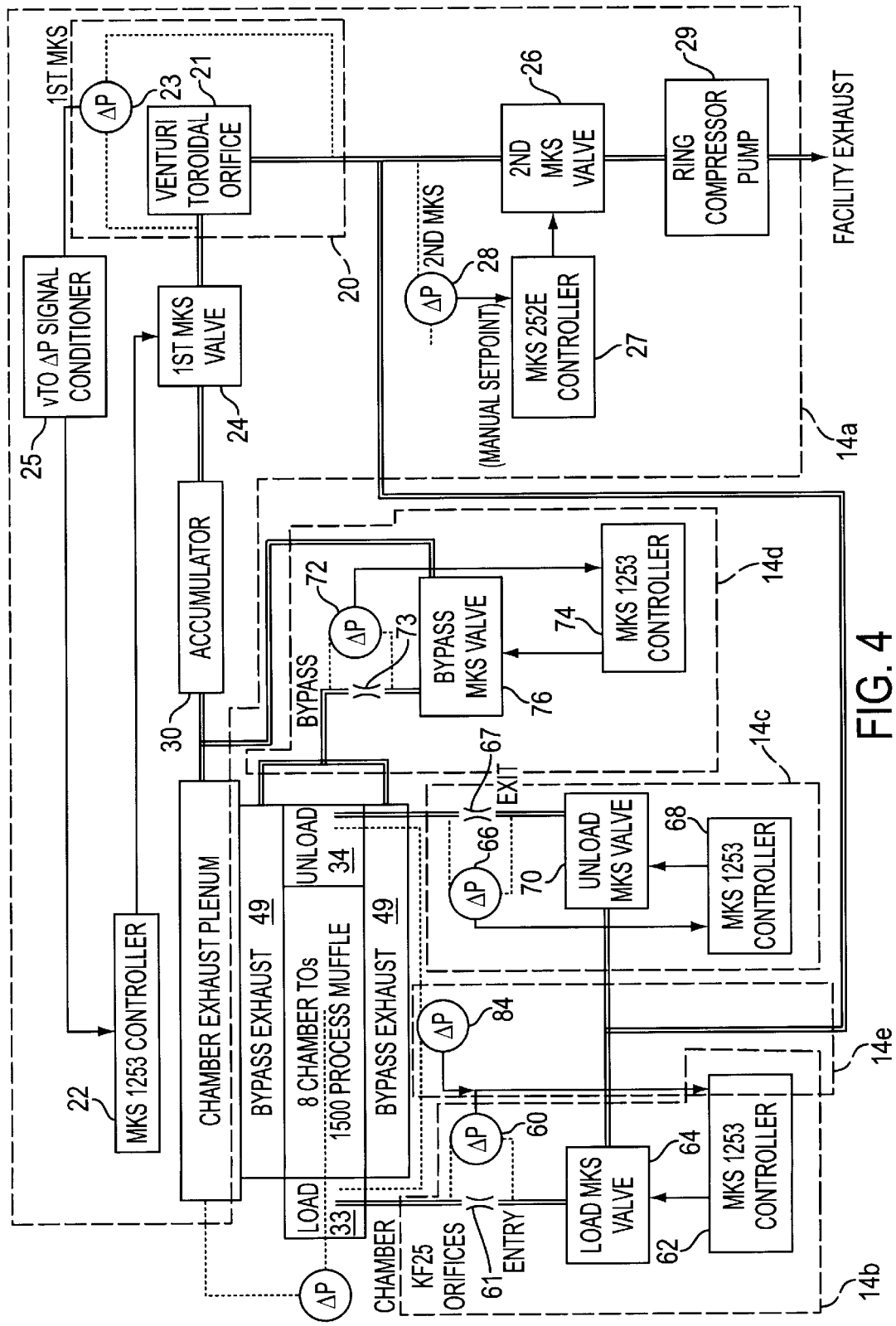
FIG. 4 is a schematic diagram of an embodiment of the exhaust flow control system of the present invention, including the transient pressure response flow control system of the present invention.
Figure 5:
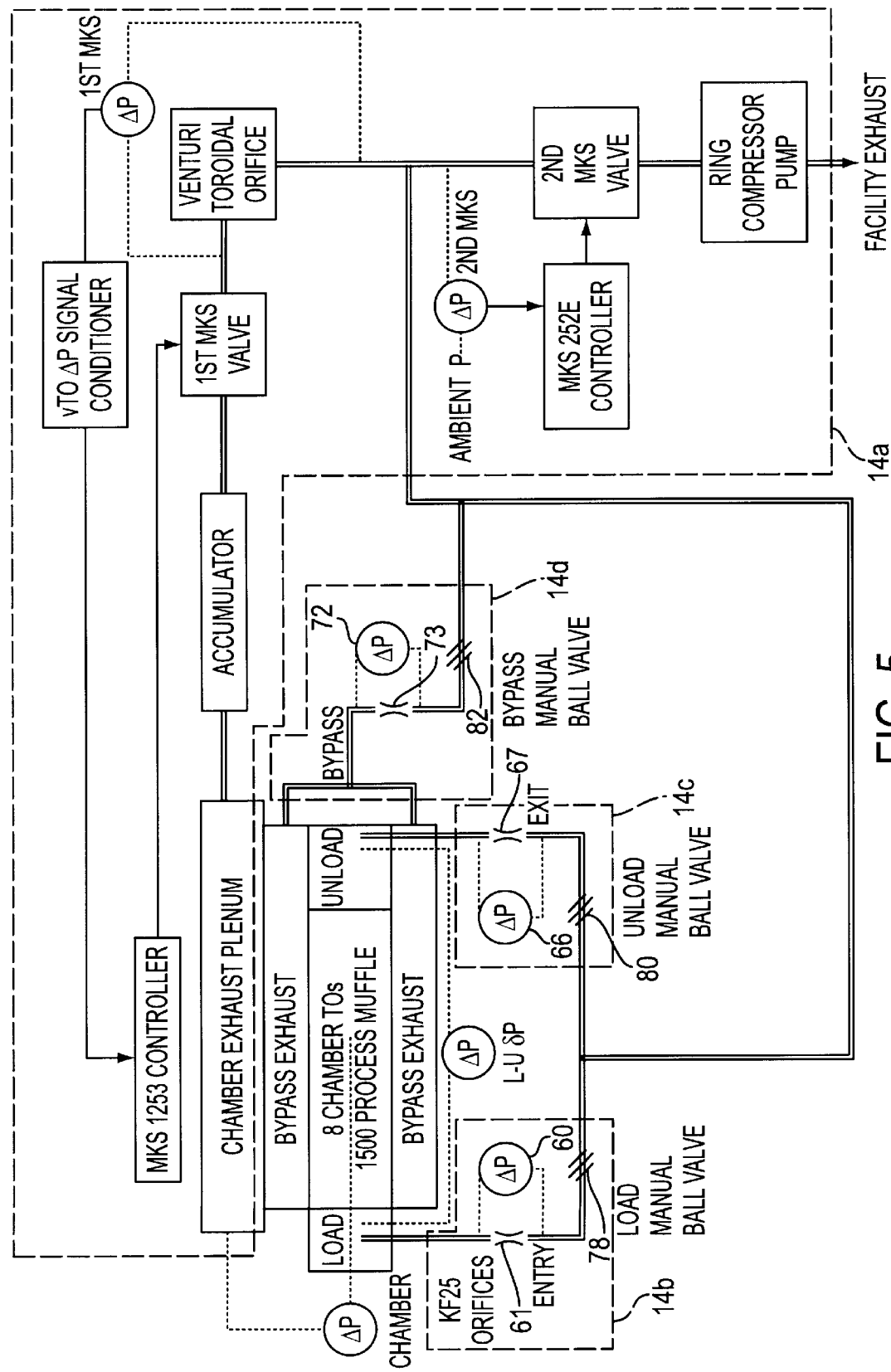
FIG. 5 is a schematic diagram of an alternative embodiment of the chemical vapor deposition and exhaust flow control system having the improved gas flow path design of the present invention.

To provide flow control of the gases within the defined gas flow paths, a flow control system 14 is employed. FIG. 1 shows the flow control system 14a and 14b employed in the prior art. FIGS. 4 and 5 show flow control systems according to two embodiments of the present invention. The flow systems include the flow controls shown in FIG. 1 and described above. The flow control system operates to selectively control the flow rate of gases within the gas flow paths such that desired flow rates are achieved and may be maintained at a substantially constant value during processing of the wafer. The particular flow rate values will vary depending on a number of factors including, how the gas flow paths are defined, the type and nature of the mechanical design of the system, the application, and the types of gaseous chemicals that are used.

Of particular advantage, the present invention provides for the separate flow control of any number of defined gas flow paths. An embodiment of the present invention having an improved exhaust gas flow path design and four flow control systems 14a–14d is depicted in FIG. 4. The distinction from prior art is essentially the placement of the multiple exhaust gas flow paths by design within the chemical vapor deposition system, and the individual control of each exhaust gas flow path, such that the chambers of an open APCVD System are isolated from intrusion of any external flow, and such that any transient or static pressure of flow imbalance external to the chambers can be compensated for by the exhaust flow control system. The active exhaust of the bypass plenums allows excess chamber flow to be extracted from the system without asymmetric flow conditions surrounding different chambers. The placement of the load and unload exhausts internal to the system, between inert gas curtains, allows the exhaust flow control system to actively maintain a desired pressure differential (near zero) across the chambers in an open APCVD System exposed to changing external environmental conditions. The first flow control system 14a is similar to that described in FIG. 1 except that two other gas flow paths (the combination of the load and unload gas paths, and the bypass exhaust gas flow path) are merged into the chamber exhaust gas flow path. According to the present invention, gas flow paths can be combined and the combined gas path controlled to achieve and/or maintain a selected flow rate of the gases. Alternatively, the paths can be combined and yet flow control of the individual paths may take place before and/or after the combination.

In this embodiment, the load and unload exhaust gas paths are separately controlled via flow control systems 14b and 14c. Specifically, the flow of inert gases within the load region 33 of the system is controlled via flow control system 14b. As described above, achieving a certain desired flow rate of the gases, and/or maintaining the flow of the gases at a substantially constant flow rate aids the balance of gas flows within the system and leads to deposition of improved films on the surface of a wafer. Further, the separate control of gases within the load region allows for directing the gases within the system to a desired gas flow path. That is, as described above, the gases flowing into the buffer modules, and in particular the outermost buffer module adjacent the load region, may be directed into the load region and exhausted via the load exhaust gas flow path. This is accomplished by maintaining the flow rate of the gases in the bypass exhaust gas flow path at a lower rate than the input flow rate of the gases in the bypass ducts (controlled by flow control system 14d). Turning again to FIG. 4, the load exhaust gas flow path is controlled by flow control system 14b which includes a sensor unit which is comprised of a pressure transducer 60 and an orifice 61, a controller 62 and a flow control unit 64. To control the gas flow in the load exhaust gas flow path, the sensor 60 measures a flow characteristic of the gases within the path, such as the pressure drop across the orifice 61 within the path. The sensor 20 sends a signal representing the measurement to the controller 62. The controller 62 compares the measurement with selected values residing in the controller memory. The controller 62 then sends a command to the flow control unit 64 responsive to the measurement, directing the unit 64 to open or close such that the flow rate of the gas remains constant within the gas flow path. The controller may be any suitable type controller. Additional sensors (not shown), such as to measure temperature in the gas flow path, can also send signals to the controller 62 so that the commands to the flow control unit 64 compensate for temperature variation in order to maintain a substantially constant mass flow.

Similarly, the flow of gases within the unload region 34 are controlled by flow control system 14c. Flow control system 14c also includes a sensor unit which is comprised of a pressure transducer 66 and an orifice 67, a controller 68 and a flow control unit 70. To control the gas flow in the load exhaust gas flow path, the sensor measures a flow characteristic of the gases within the path, such as the pressure drop across the orifice 67 within the path. The sensor sends a signal representing the measurement to the controller 68 and the controller 68 compares the measurement with selected values residing in the controller memory. The controller 68 then sends a command to the flow control unit 70 responsive to the measurement, directing the unit 70 to open or close such that the flow rate of the gas remains constant within the gas flow path.

Flow control system 14d controls the flow of gases within the bypass exhaust gas flow path. Gases are conveyed through the two bypass vents 49 on each side of the reactor. Preferably, the gases exit at one end of each of the vents 49 and the two gas streams are combined. The pressure in the combined gas stream is measured across an orifice 73 by pressure transducer 72. As in the other flow control systems, the pressure measurement is sent to a controller 74 and the controller 74 responsively adjusts a flow control unit 76 to maintain a certain flow rate.

While an automatic feedback flow control system for inert gases is preferred, it should be noted that a manual system can be employed to control one or more of the gas flow paths where the exhaust stream is clean and not subject to geometric change over time due to deposition by-products. Referring to FIG. 5, flow control systems 14b, 14c and 14d are shown where the controller has essentially been replaced by an operator. To achieve and/or maintain a substantially constant flow rate within a gas flow path, the operator adjusts manual flow control units 78, 80 or 82, such as a conventional manual ball valve. The operator may select a stable flow characteristic, such as a pressure or flow rate, by manually adjusting the valve. The operator will typically select a stable flow characteristic for each process or recipe condition conducted in the reactor. When a new process condition is entered, the valves will typically require adjustment to achieve a new stable flow characteristic.

Control of the flow of gases in the system provides a number of benefits. One of the most important of course is the deposition of good quality films as described in detail above. In another embodiment of present invention, the method of flow control is employed to control transients, or disturbances within the system. During operation of a wafer processing system, there is typically a pressure differential between the exterior environment and the internal environment of the system. The activity of loading and unloading the wafers exposes the system to this external environment and causes transient pressure disturbances within the system. Even when the system is a APCVD reactor, there are still typically pressure differences compared to the external environment. Especially for APCVD reactors, any disturbance in the external environment, such as opening doors into pressurized clean room areas around the equipment can directly affect the deposition chamber environment through the open path into the reactor. The transient pressure disturbances impact the flow of the gases within the system. Referring again to FIG. 4, a transient flow control system 14e is shown according to another embodiment of the present invention. To minimize transient disturbances, the present invention balances the pressure across the chambers within the system by adjusting the flow of gases either in the load 33 or unload 34 region of the muffle. This system is referred to as the muffle balance procedure, or transient pressure response procedure. Preferably, the system and method of the invention maintains a pressure differential of substantially zero (i.e. $\Delta P \approx 0$) between the load 33 and unload 34 regions. This is illustrated in flow control system 14e in FIG. 4. The flow control system 14e includes a pressure transducer 84, which is coupled to the load and unload regions of the muffle. The pressure transducer 84 measures the pressure differential between the load 33 and unload 34 regions of the muffle 32 and send this information as a signal to a controller 62. In this instance, the controller 62 is the same as utilized in the load exhaust flow control system 14b, however, a separate controller could be used. The signal is received by the controller 62, and the controller outputs a signal to adjust one of the flow control valves 64 or 70 coupled to either the load or unload regions, respectively. The flow control valve 64 or 70 is selectively adjusted by the controller 62 to maintain a pressure differential of approximately zero between the load and unload regions of the muffle by increasing or decreasing the exhaust flow from either the load or unload region. By maintaining a pressure differential of zero, the flow rates of the gases within the deposition chambers are maintained at substantially constant rates and do not substantially vary in response to the transient pressure disturbances which affect the flows at the load and unload ends of the muffle.

In addition to transient pressure disturbances due to loading and unloading of the wafers, a thermal imbalance in the system also will cause a pressure differential from one end of the muffle to the other. Often times, the thermal load is greater at the load 33 region of the muffle 32 since there is higher energy input needed in this region to heat the wafers and transport means for processing. Advantageously, the transient control system 14e provides a system and method for maintaining a desirable minimal pressure differential across the deposition chambers in this situation as well.

Figure 6:
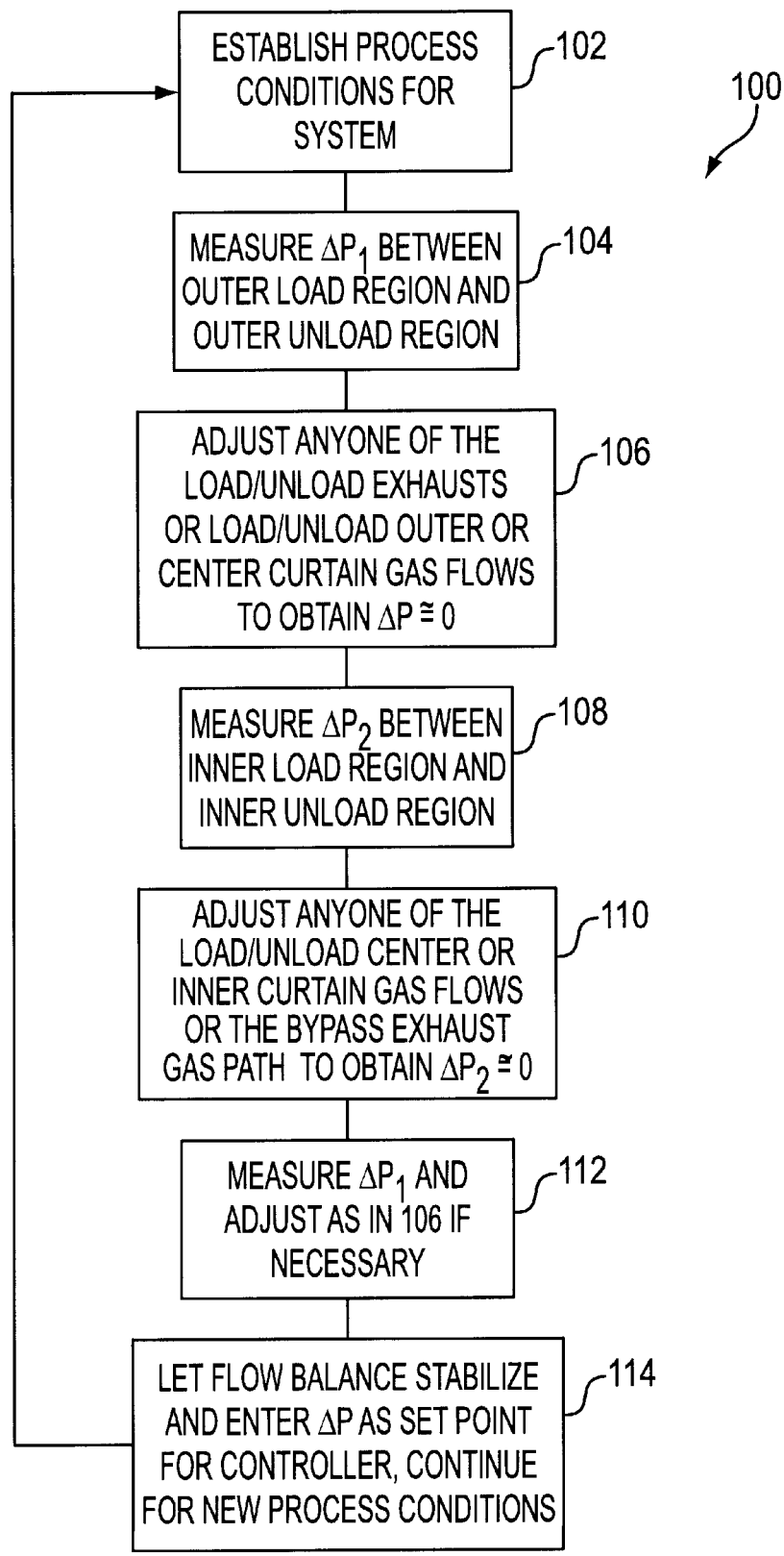
FIG. 6 is a flow chart illustrating one embodiment of the transient pressure response flow control method of the present invention.

The transient flow control method is schematically illustrated by the flow chart 100 in FIG. 6. First, the process conditions for the reactor are established at step 102. The process conditions include the desired gas flows for the various reactive and inert gases for the particular type of film to be deposited on the wafer surface. For example, the process conditions might include the input flow rates of gases in the injector ports. These flow rate values will be selected based on achieving desirable uniformity of the gas flow about the wafer. Also flow rates of inert gases though the protective shield may be specified. The flow rate of the chamber process exhaust may be selected for chemical containment. The bypass exhaust flow rate may be established, and the flow rates of gases in the load and unload regions of the muffle are selected.

Next, the pressure differential between the outermost load region and the outermost unload region ($\Delta P_1$) is measured at step 104. Adjustments are made to any number of flow control paths via their associated flow control units to maintain $\Delta P_1$ equal to approximately zero at step 106. Specifically, flow control units are opened or closed which increases or decreases the flow rate within the flow control path such that a value $\Delta P_1$ equal to approximately zero is maintained. Any one, or a combination, of the following gas flow paths may be adjusted: the load exhaust gas path, the unload exhaust gas path, the load outer and center curtains, and the unload outer and center curtains. As shown in this illustration, the gas flow path may include gas inlets such as the load and unload outer or center curtains, and is not limited to the exhaust paths.

Since the length of the load and unload regions of the muffle may be relatively long, it is preferred to also measure the pressure at the innermost position of the load and unload regions, respectively. Accordingly, at step 108 the pressure differential between the innermost load region and the innermost unload region ($\Delta P_2$) is measured. Adjustments in flow rates are made to any number of flow control paths via the associated flow control units to maintain $\Delta P_2$ equal to approximately zero at step 110. Any one, or a combination, of the following gas flow paths may be adjusted: the load center and inner curtains, the unload center and inner curtains, and the bypass exhaust gas flow path.

$\Delta P_1$ is re-measured at step 112 and the flow rates may be adjusted to maintain $\Delta P_1 \approx 0$ according to step 106 as necessary. Finally, the system is left to stabilize at step 114, and the resulting $\Delta P$ value is entered as a setpoint for the controller to maintain automatically by adjusting one of the load or unload exhaust valves or $N_2$ curtains through feedback control. The program is re-executed at step 102 for a new process condition.

Figure 7:
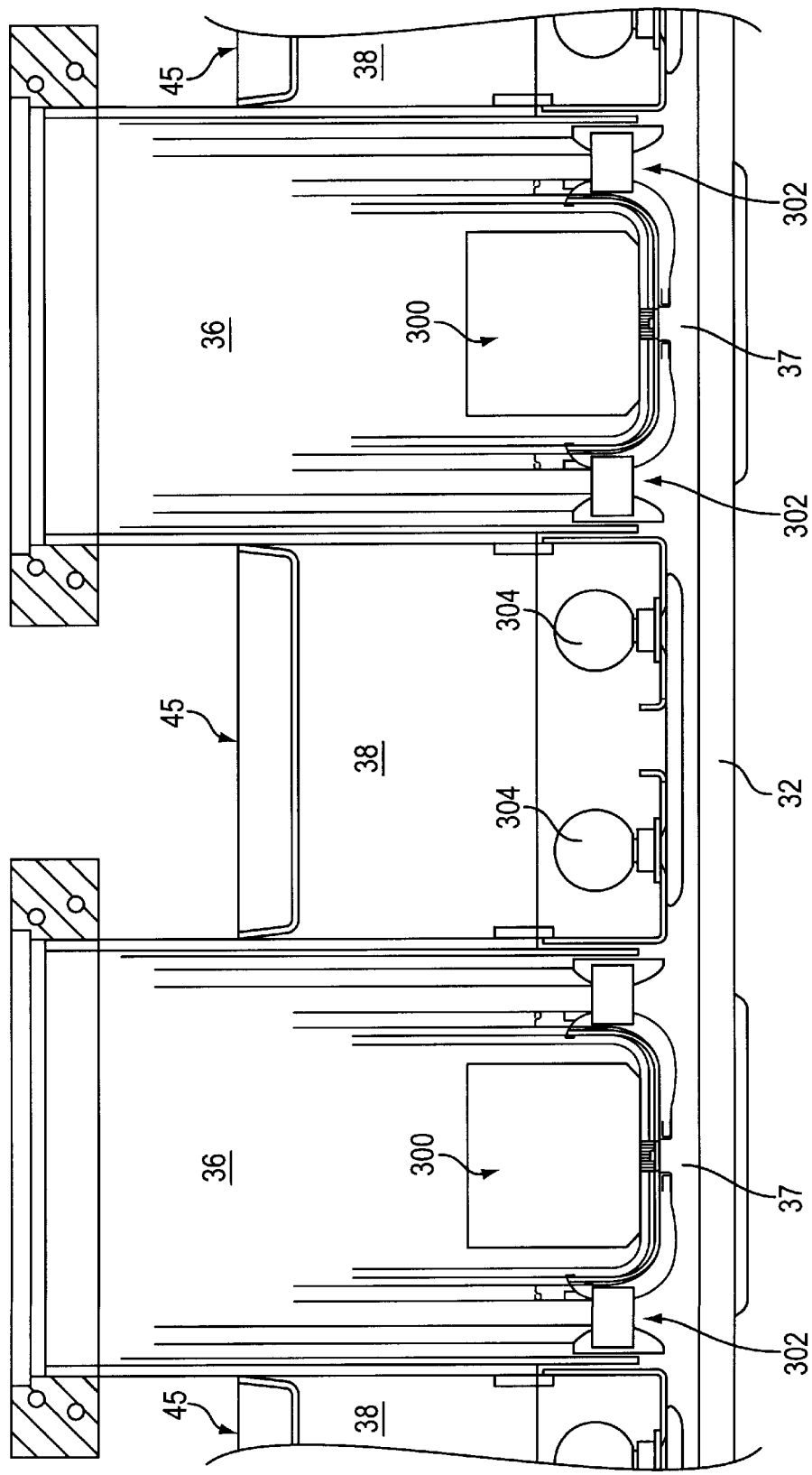
FIG. 7 is a schematic cross-sectional view of one processing chamber of an alternative exemplary chemical vapor deposition system which may be used in the present invention.
Figure 8:
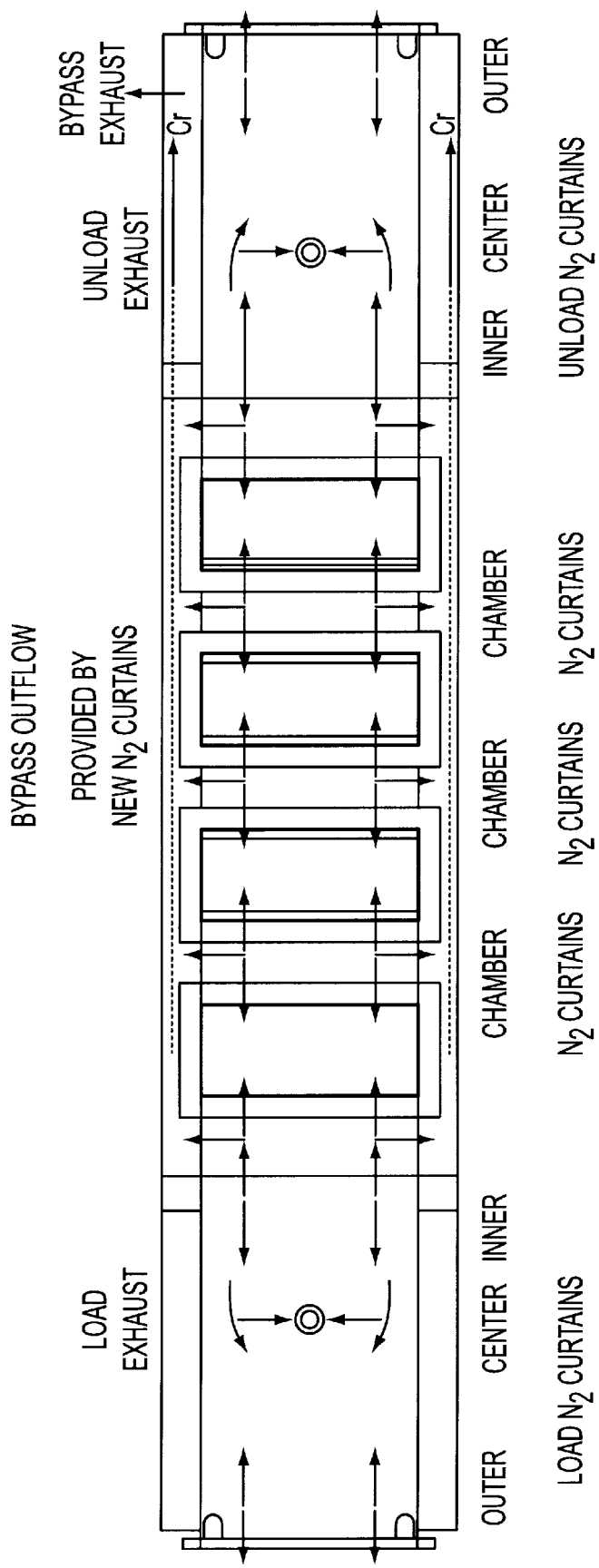
FIG. 8 is a top plan view illustrating the path of the various gases as they are exhausted through the APCVD System having processing chambers and buffer modules of the type shown in FIG. 7.

An alternative embodiment of the invention is shown in FIG. 7. FIG. 7 is a schematic view of two processing chambers 36 and the buffer module 38 in between them for an alternative CVD system, and in particular showing an enlarged view of a process chamber module 36. An injector assembly 300 and shield assembly 302 are employed. The shield assembly 302 is further described in U.S. Pat. No. 5,849,088 which is hereby incorporated by reference. The buffer modules incorporate nitrogen chamber curtains 304 in the bypass duct 45 which allow a reaction chamber exhaust ratio of less than 1.0 while maintaining containment of chemicals in the deposition region. The additional nitrogen curtain flow will supply both the chamber exhaust and bypass exhaust gas so the chamber bypass outflow will remove contaminants, such as chromium (Cr) vapors which may by emitted from the bypass duct. Both inter-chamber and inter-pass load/unload Cr peak contamination may be minimized. Preferably, the load and unload regions of the muffle are purged using three nitrogen curtains each, 50*a*, 50*b* and 50*c* as in FIG. 3*a*. Of particular advantage, films may be deposited having very low Cr contamination according to the present invention. The gas flows within the system and muffle of FIG. 7 are illustrated in FIG. 8.

In summary, the improved wafer processing reactor incorporates a bypass exhaust plenum whereby excess inert gas from inside the deposition chamber or from buffer regions between chambers is controllably removed from the reactor. This provides improved isolation of each process chamber, improved balance between chambers, and removal of contaminants which might otherwise be drawn into the process region of the process chamber. Control of load and unload inert curtain gas exhaust provides a pressure balance across the reactor in the presence of thermal load fluctuations, and internal pressure fluctuations, as may occur during loading and unloading wafers, and external perturbations which may occur from such things as opening doors. The wafer processing reactor includes exhaust flow control of multiple paths to maintain stable pressure and flow in the chamber deposition region.

As is apparent from the forgoing, the present invention provides an improved flow control system and method. The inventive system and method may be used with a wafer processing system to achieve improved uniformity of reagents within the deposition region, and to provide greater control and direction of the flow of gases within the system, thereby enhancing the quality of the deposited film. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A chemical vapor deposition processing system for delivering at least one reactant gas and an inert gas to process a wafer or other substrate, comprising:

at least one processing chamber including a processing region formed therein and having at least one gas flow path for conveying said at least one reactant gas into said processing region and another gas flow path for delivering said inert gas to said processing region, individual exhaust gas flow paths for removing said reactant gas completely within one said path along with some of said inert gas, and another said path for removing only excess inert gas from said processing chamber, and an exhaust flow control system for separately controlling the flow of gas from each of said exhaust gas flow paths to confine the processing region such that only said reactant and inert gas delivered inside said process chamber is exhausted through said processing region.

2. The system of claim 1 wherein the exhaust flow control system for the at least one reactant gas exhaust flow path is configured to exhaust reactant gases and some of said inert gases from said processing region at a substantially constant selected flow rate.

3. The system of claim 1 wherein the said another gas flow path includes inert gas buffer modules adjacent said processing chamber for delivering and/or receiving inert gases to further isolate the processing region, and a bypass exhaust plenum for exhausting excess inert gas supplied to the processing chamber and the inert gas buffer modules.

4. The system as in claim 1 including at least one inert gas flow path at the wafer load and unload regions of said processing system, an exhaust flow path within each of said regions, and means for controlling the exhaust of inert gases from each of said regions so that the pressure differential across said processing region is substantially minimized, even though said processing system has an imbalanced pressure gradient across it.

5. The system of claim 4 wherein the at least one inert gas flow path includes:

a load exhaust gas flow path for exhausting said at least one inert gas, said path formed by a load region positioned on one side of said process chambers and having a plenum body with a lower plenum with a slot in a lower surface for receiving said at least one inert gas and an upper plenum with an array of holes in a lower surface for receiving said at least one inert gas from said lower plenum and a load outlet port coupled to said upper plenum for exhausting said one inert gas from said load region; and an unload exhaust gas flow path, for exhausting said at least one inert gas, said path formed by an unload region positioned on the opposite side of said process chambers and having a plenum body with a lower plenum with a slot in a lower surface for receiving said at least one inert gas and an upper plenum with an array of holes in a lower surface for receiving said at least one inert gas from said lower plenum and an unload outlet port coupled to said upper plenum for exhausting said one inert gas from said unload region.

6. The system of claim 1, wherein said another gas flow path includes a bypass exhaust gas flow path which is formed by an elongated buffer module on each side of said at least one processing chamber having two elongated baffles positioned adjacent one another to form an elongated slot across the full width of the system, and an open cavity above said slot for receiving said at least one inert gas, and a bypass plenum disposed at each end of said cavity for exhausting said gas.

7. The system of claim 1, wherein said exhuast flow control system further comprise:

a sensor coupled to each of said exhaust gas flow paths for measuring a flow characteristic of the gas within the exhaust flow path;

controllers for receiving a signal from the sensor coupled to each of said exhaust gas flow paths; and flow control units in each of the exhaust gas flow paths selectively adjustable to control the flow rate of the gas in said path responsive to said controller to maintain the flow of the gases within the gas flow paths at a selected value.

8. The system of claim 7 wherein the sensor coupled to the exhaust flow path includes an orifice placed in said exhaust gas flow path.

9. The system of claim 8 wherein the exhaust flow control system further includes means for measuring the gas temperature at the orifice to correct the correlation between pressure differential and flow rate for temperature of the gas.

10. The system of claim 1 wherein the process chambers are open to the ambient atmosphere such that the deposition process occurs at or near atmospheric pressure.

11. A chemical vapor deposition processing system for delivering at least one reactant gas and an inert gas to process a wafer or other substrate, comprising:

at least one process chamber including a processing region formed therein and having at least one inert gas flow path for conveying said at least one reactant gas into said processing region and another gas flow path for delivering said inert gas to said wafer processing system, at least one exhaust gas flow path for removing said reactant gas and inert gas from said processing chamber, and an exhaust flow control system for separately controlling the flow of gas from said exhaust gas flow path, a wafer load and unload region within said processing system at the load and unload sides of said processing region, each having at least one inert gas flow path for delivering inert gas to said load and unload regions, a load exhaust path and an unload exhaust path internal to said inert gas flow regions, a first sensor coupled to said load exhaust gas path for measuring a flow characteristic of said gas within said load exhaust gas flow path;

a second sensor coupled to said unload exhaust gas path for measuring a flow characteristic of said gas within said unload gas flow path;

controllers for receiving signals from said first and second sensors; and flow control units in each of said load and unload exhaust gas flow paths, said flow control units being selectively adjusted to control the flow rate of the gases in each of said load and unload paths responsive to said controller.

12. The system of claim 11 wherein the control units are adjusted so that the flow rates of the gases in the load and unload exhaust paths are maintained at substantially constant selected values.

13. The system as in claim 11 wherein the control units are adjusted so that the flow rates of gases in the load and unload exhaust paths maintain a substantially zero pressure differential between the load and unload sides of said system.

14. A system as in claim 11 in which said load region has a plenum body with a lower plenum with a slot in a lower surface for receiving an inert gas, and an upper plenum with an array of holes in a lower surface for receiving inert gas from said lower plenum and a load outlet port coupled to said upper plenum for exhausting said gas from said load region, and said unload region has a plenum body with a lower plenum with a slot in a lower surface for receiving said at least one inert gas and an upper plenum with an array of holes in a lower surface for receiving said at least one inert gas from said lower plenum and an unload outlet port coupled to said upper plenum for exhausting said gas from said unload region.

15. The system of claim 11 wherein the process chambers are open to the ambient atmosphere such that the deposition process occurs at or near atmospheric pressure.

16. The system of claim 15 wherein the flow control units are adjusted such that the flow rates of the gases in the load and unload exhaust paths are maintained at substantially constant selected separate values.

17. The system of claim 15 wherein the flow control units are adjusted such that the flow rates of said inert gas within the load and unload exhaust flow paths are separately and selectively adjusted to maintain a substantially constant selected flow rate within one of said exhaust gas flow paths, and a varying flow rate in the other of said gas flow paths such that the pressure differential across said open chambers is controlled to a substantially constant value near zero even when wafers are loaded or unloaded, or when external room pressure or flow changes occur.

18. The system of claim 1 or 11 wherein said exhaust flow control system includes a self-cleaning orifice across which the pressure differential is measured to establish the flow rate of gases through the orifice.

19. The system of claim 11 where said inert gas is applied to a load purge curtain and an unload purge curtain and the flow control units are selectively adjusted to maintain the pressure differential across the open chambers at a substantially constant value near zero, even when wafers are loaded or unloaded, or when external room pressure or flow changes occur.

20. The system of claim 11 where said inert gas is applied to a load purge curtain and an unload purge curtain and the flow control units are selectively adjusted to maintain the pressure differential across the open chambers at a substantially constant value near zero, even when wafers are loaded or unloaded, or when external room pressure or flow changes occur.

21. The system of claim 20, wherein the process chambers are open to the ambient atmosphere such that the deposition process occurs at or near atmospheric pressure.

* * * * *